US008293581B2

(12) United States Patent
Su et al.

(10) Patent No.: US 8,293,581 B2
(45) Date of Patent: Oct. 23, 2012

(54) SEMICONDUCTOR CHIP WITH PROTECTIVE SCRIBE STRUCTURE

(75) Inventors: Michael Z. Su, Round Rock, TX (US); Lei Fu, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/388,064

(22) Filed: Feb. 18, 2009

(65) Prior Publication Data
US 2010/0207250 A1 Aug. 19, 2010

(51) Int. Cl.
*H01L 21/00* (2006.01)
*H01L 23/544* (2006.01)
(52) U.S. Cl. . 438/113; 438/462; 257/620; 257/E21.599; 257/E23.194
(58) Field of Classification Search .................. 257/620
See application file for complete search history.

(56) References Cited

U.S. PATENT DOCUMENTS

| | | | |
|---|---|---|---|
| 6,049,124 A | 4/2000 | Raiser et al. | |
| 6,493,229 B2 | 12/2002 | Akram et al. | |
| 7,176,555 B1* | 2/2007 | Jao et al. | 257/620 |
| 2002/0043721 A1 | 4/2002 | Weber | |
| 2005/0269702 A1* | 12/2005 | Otsuka | 257/750 |
| 2006/0163720 A1* | 7/2006 | Hirata | 257/704 |
| 2006/0278957 A1 | 12/2006 | Lin et al. | |
| 2007/0069336 A1* | 3/2007 | Ning | 257/619 |
| 2008/0083959 A1 | 4/2008 | Wu et al. | |
| 2008/0277659 A1* | 11/2008 | Hsu et al. | 257/48 |
| 2009/0085168 A1* | 4/2009 | Kobayashi et al. | 257/620 |
| 2009/0321890 A1* | 12/2009 | Jeng et al. | 257/620 |

OTHER PUBLICATIONS

USPTO Office Action mailed Jul. 9, 2009; U.S. Appl. No. 11/853,122.
U.S. Appl. No. 11/853,122, filed Sep. 11, 2007, Michael Su et al.
U.S. Appl. No. 12/132,734, filed Jun. 4, 2008, Michael Su et al.
U.S. Appl. No. 12/388,092, filed Feb. 18, 2009, Michael Su et al.
Guotao Wang et. al.; *Chip packaging interaction: a critical concern for Cu/low k packaging*; www.sciencedirect.com; Microelectronics Reliability 45 (2005) 1079-1093.
Marie-Claude Paquet et al.; *Underfill Selection Strategy for Pb-Free, Low-K and Fine Pitch Organic Flip Chip Applications*; 2006 Electronic Components and Technology Conference; 1-4244-0152-6/06/ $20.00 © 2006 IEEE; pp. 1595-1603.
John Baliga; *Yet Another Way to Use BCB*; Semiconductor International; http://www.semiconductor.net/article/CA6347341.html; Jul. 1, 2006; pp. 1-3.
USPTO Office Action notification date Oct. 27, 2009; U.S. Appl. No. 12/132,734.
USPTO Notice of Allowance mailed Nov. 3, 2009; U.S. Appl. No. 11/853,122.

* cited by examiner

*Primary Examiner* — Michelle Mandala
*Assistant Examiner* — Shaka White
(74) *Attorney, Agent, or Firm* — Ditthavong Mori & Steiner, P.C.

(57) ABSTRACT

Apparatus and methods pertaining to die scribe structures are disclosed. In one aspect, a method of manufacturing is provided that includes fabricating an active region of a semiconductor die so that the active region has at least one corner. A scribe structure is fabricated around the active region so that the scribe structure includes at least one fillet.

27 Claims, 4 Drawing Sheets

US 8,293,581 B2

SEMICONDUCTOR CHIP WITH PROTECTIVE SCRIBE STRUCTURE

BACKGROUND OF THE INVENTION

1. Field of the Invention

This invention relates generally to semiconductor processing, and more particularly to scribe structures and methods of making the same for semiconductor chips.

2. Description of the Related Art

Semiconductor chips or dice are typically manufactured en masse as part of a semiconductor wafer. Selected portions of the semiconductor wafer are set aside for each of the dice, and at an appropriate point in the process flow, the semiconductor dice are singulated from the wafer by some form of cutting process. In various conventional techniques, the cutting process is performed by mechanical sawing or laser scribing. These techniques may be used to completely cleave the semiconductor dice from the wafer, or to establish grooves as a precursor to a mechanical breaking process. In order to protect the individual dice from damage that may occur during the dicing operation, the dice are segregated laterally from each other by so-called dicing streets, which are merely portions of the semiconductor wafer in which no active circuit structures are formed. Further protection is provided by way of a scribe line structure that surrounds each semiconductor die.

A typical conventional scribe line structure consists of a frame-like structure that, when viewed from above, resembles a rectangular fortress wall. The scribe structure is fabricated around the active device region of the semiconductor die. In the conventional form, there is typically a gap between the active region and, in particular, the corners of the active region and the interior corners of the rectangular scribe structure.

The dicing process, despite advances in saw manufacture and laser cutting processes, is a thermo-mechanically stressful operation. During mechanical sawing, the dice undergo significant cyclic stresses and some heating. During laser scribing, the dice not only undergo significant thermal stresses that can, if high enough, even ablate portions of the scribe structure. Multiple heating cycles occur due horizontal and vertical dicing across a given die corner. It turns out that the corners of the semiconductor dice are particularly susceptible to both thermal shocks and mechanical stresses. By definition, corners create stress risers that are less resilient to mechanical stresses then other portions. Cracks or other types of damage created at the corners of the semiconductor dice can, if not checked, propagate inward and potentially damage the delicate circuit structures within the active region.

The present invention is directed to overcoming or reducing the effects of one or more of the foregoing disadvantages.

SUMMARY OF THE INVENTION

In accordance with one aspect of the present invention, a method of manufacturing is provided that includes fabricating an active region of a semiconductor die so that the active region has at least one corner. A scribe structure is fabricated around the active region so that the scribe structure includes at least one fillet.

In accordance with another aspect of the present invention, a method of manufacturing is provided that includes, in a semiconductor wafer that has at least one die, fabricating an active region with at least one corner. A scribe structure is fabricated around the active region so that the scribe structure includes at least one fillet.

In accordance with another aspect of the present invention, an apparatus is provided that includes a semiconductor die that has at least one corner and an active region. The active region also has at least one corner. A scribe structure bounds the active region. The scribe structure has at least one fillet positioned adjacent the at least one corner of the semiconductor die.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
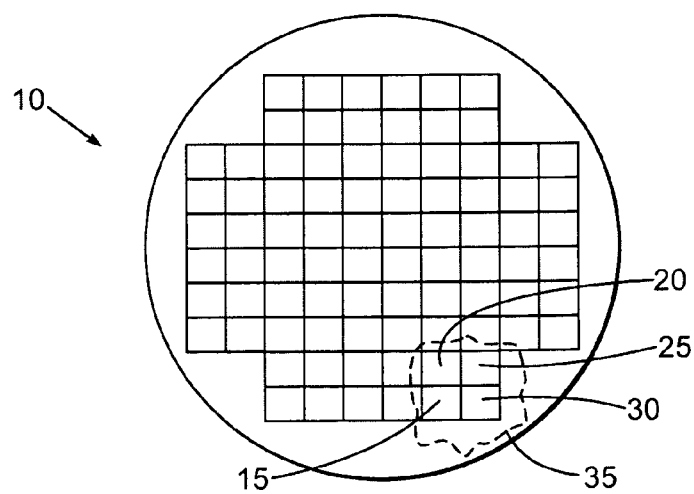
FIG. 1 is an overhead view of an exemplary semiconductor wafer that includes a number of dice.

In the drawings described below, reference numerals are generally repeated where identical elements appear in more than one figure. Turning now to the drawings, and in particular to FIG. 1, therein is shown an overhead view of an exemplary semiconductor wafer 10 that includes a number of dice, four of which are labeled 15, 20, 25 and 30, respectively. The wafer 10 may be composed of silicon, gallium arsenide, or other semiconductor materials as desired. The number of dice 15, 20, 25 and 30 may vary greatly depending upon the device geometry, the size of the wafer 10 and other factors. The dice 15, 20, 25 and 30 may be virtually any type of integrated circuits, such as microprocessors, graphics processors, combined microprocessors and graphics processors, memory devices, application specific integrated circuits or virtually any other type of semiconductor based circuits. If implemented as processors of one sort or another, the dice 15, 20, 25 and 30 may be single or multicore. To illustrate additional details of the dice 15, 20, 25 and 30, a portion of FIG. 1 circumscribed by the irregularly shaped dashed area 35 will be shown at greater magnification in FIG. 2.

Figure 2:
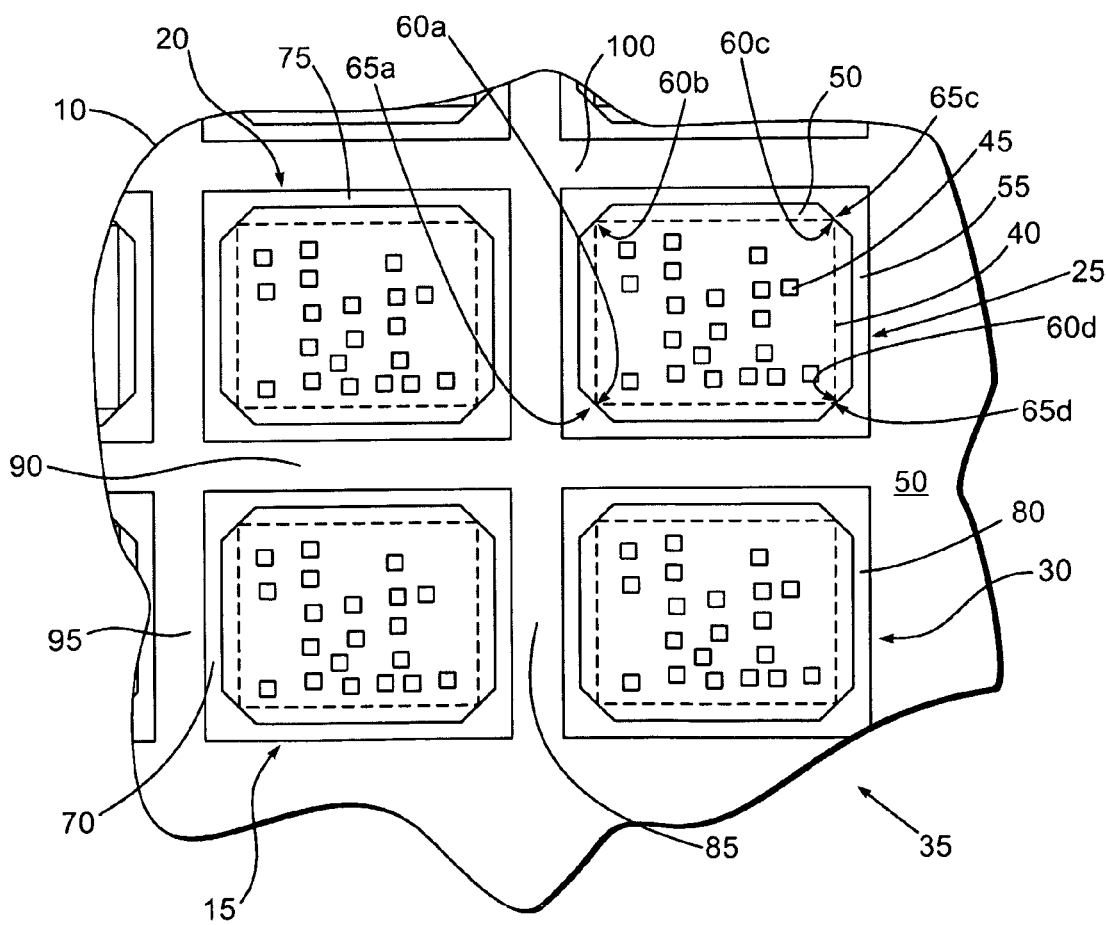
FIG. 2 is a portion of FIG. 1 shown at greater magnification.

Attention is now turned to FIG. 2, which is an overhead view of the portion 35 of FIG. 1 shown at greater magnification. FIGS. 1 and 2 depict the semiconductor wafer 10 from the circuitry side of the dice 15, 20, 25 and 30 and at a stage in processing just prior to die singulation. Thus, the surfaces that are visible in FIGS. 1 and 2 consist of interlevel dielectric materials and scribe lines as described more fully below. The portions of the wafer 10 that consist of semiconductor materials are generally beneath those portions that are visible in FIGS. 1 and 2 as viewed in the page. Each of the dice 15, 20, 25 and 30 (as well as the other dice shown in FIG. 1) may be substantially identical. Accordingly, the die 25 will be used to describe the structure of the other dice 15, 20, and 30. The die 25 includes an active circuitry region 40. The active circuitry region 40 includes a plurality of I/O pads 45 that may be bump pads, wire bond pads or other type of I/O pads as desired. Beneath the pads 45 but not visible in FIG. 2, is a series of stacked interconnect layers leading down to device circuitry. While only a few pads 45 are depicted for simplicity of illustration, the skilled artisan will appreciate that there may be thousands of such pads. The pads 45 are surrounded laterally by interlevel dielectric material 50. The active region 40 and the small portions of interlevel dielectric material 50 surrounding the active region 40 are collectively bound by a scribe structure 55 that forms a frame-like structure that surrounds the active region 40. The scribe structure 55 is designed to act as both a crack stop and also as a protective structure to protect the active circuit region 40 during subsequent singulation. For a variety of reasons, the four corners 60a, 60b, 60c and 60d of the active region 40 are particularly susceptible to damage and cracks due to the singulation process. Accordingly, the scribe structure 55 includes respective fillets 65a, 65b, 65c and 65d that extend to the corners 60a, 60b, 60c and 60d of the active region 40. The fillets 65a, 65b, 65c and 65d provide enhanced protection for the corners 60a, 60b, 60c and 60d of this active region 40 both during the singulation process and during subsequent events that impart stresses on the active region 40 such as thermal cycling. While four fillets 65a, 65b, 65c and 65d are provided proximate the corresponding corners 60a, 60b, 60c and 60d, it should be understood that the scribe structure 55 could be fabricated with less than four fillets 65a, 65b, 65c and 65d and perhaps just one.

The scribe structure 55 of the die 25 is separated laterally from respective scribe line structures 70, 75 and 80 of the dice 10, 20 and 30 so as to define dicing streets 85 and 90. Additional dicing streets 95 and 100 are defined to the left and above the die 20. The dice 15, 20, 25 and 30 will be singulated from the wafer 10 generally along the dicing streets 85, 90, 95 and 100.

Figure 3:
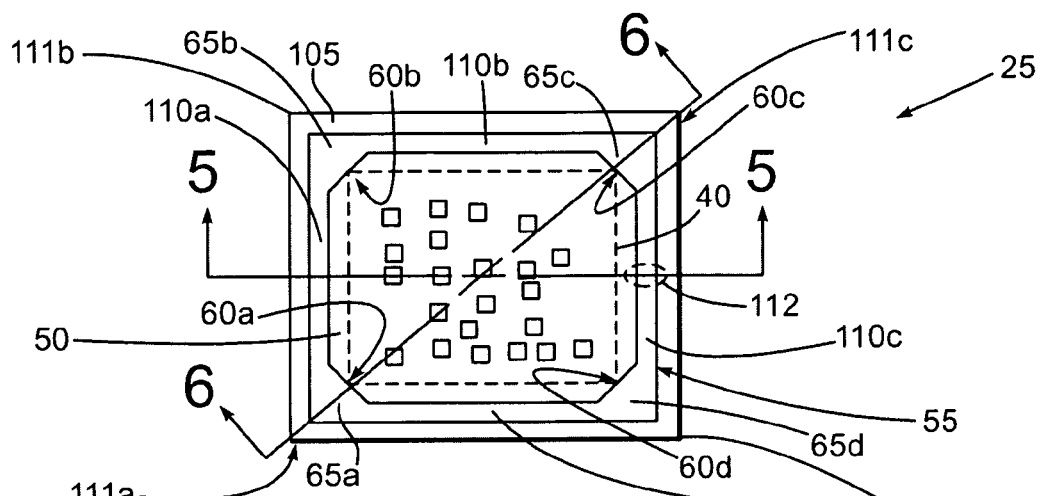
FIG. 3 is an overhead view of a die singulated from the wafer of FIG. 1.

Attention is now turned to FIG. 3, which is an overhead view of the die 25 singulated from the wafer 10 depicted in FIG. 1. The singulation process advantageously occurs some lateral distance outside the scribe structure 55 to leave a border region 105 as shown. The portion of the border region 105 visible in FIG. 3 consists of the dielectric material 50. For discussion purposes, the scribe structure 55 may be subdivided into four walls 110a, 110b, 110c and 110d that are interconnected by the fillets 65a, 65b, 65c and 65d. The singulation may be carried out by a variety of techniques, such as sawing, laser cutting, combinations of these with or without breaking or the like. Whether by saw, laser or the like, the singulation process places great stresses on the perimeter of the die 25 and particularly the die corners 111a, 111b, 111c and 111d. The fillets 65a, 65b, 65c and 65d provide enhanced protection for the corners 60a, 60b, 60c and 60d of the active region 40 against cracks or other forms of damage that may begin or occur during the singulation process.

Figure 4:
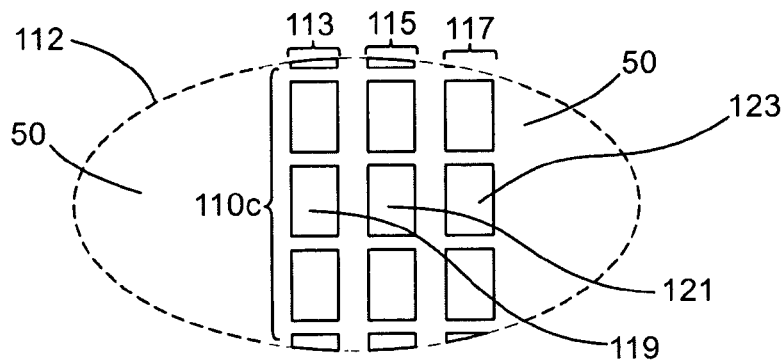
FIG. 4 is a portion of FIG. 3 shown at greater magnification.

The portion of the wall 110c circumscribed by the dashed oval 112 will be shown at greater magnification in FIG. 4. Referring now to FIG. 4, the wall 110c may consist of three rows 113, 115 and 117 of structures surrounded laterally by the dielectric material 50. The rows 113, 115 and 117 of structures may each consist of plural segments or be unsegmented as desired. In this illustrative embodiment, the rows 113, 115 and 117 are segmented. Three exemplary segments of the rows 113, 115 and 117 are labeled 119, 121 and 123, respectively. Additional details of the segments 119, 121 and 123 will be illustrated in FIG. 5.

Figure 5:
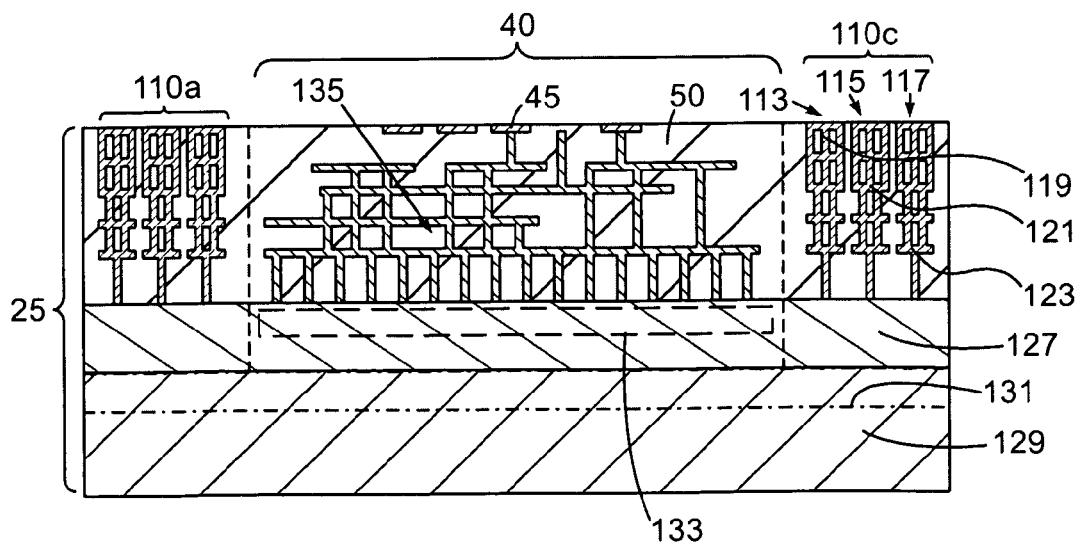
FIG. 5 is a sectional view of FIG. 3 taken at section 5-5.

FIG. 5 is a sectional view of FIG. 3 taken at section 5-5. The die 25 may consist of an active semiconductor layer 127 and an underlying bulk semiconductor layer 129. If the die 25 is implemented as a semiconductor-on-insulator design, then an intervening buried insulator layer of silicon dioxide or other dielectric materials represented by the dashed box 131 may be interposed between the base layer 129 and the device layer 127. The active circuitry of the die 25, represented by the rectangular dashed box 133 in the device layer 127, is positioned in the active region 40. The portion of the active region 40 above the device layer 127 may consist of a build-up of multiple conducting interconnect layers and interlevel dielectric material 50. A simplified representation of the plural interconnect layers connecting the active circuitry 133 to the input/output pads 45 is shown and collectively labeled 135. As will be described in more detail below, the interlevel dielectric material 50 may actually consist of several stacked layers of dielectric material.

The scribe structure walls 110a and 110c are visible in FIG. 5. The walls 110a and 110c (as well as the walls 110b and 110d shown in FIG. 3) may be substantially identical in structure. Section 5-5 passes through the segments 119, 121 and 123 of the rows 113, 115 and 117 of the wall 110c depicted in FIG. 4. Accordingly, the wall 110c will be used to describe the structure generally of the other walls 110b, 110c and 110d. The segments 119, 121 and 123 extend from the device layer 127 up to the top of the interlevel dielectric 50. As described in more detail below, the segments 119, 121 and 123 may be fabricated from sequentially fabricated vias and conductor layers interspersed with interlevel dielectric layers, much in the same way that the various interconnect and interlevel dielectric layers making up the interconnect system 135 are fabricated. While the rows 113, 115 and 117 are depicted as separate structures, it should be understood that one or more of the rows 113, 115 and 117 may be joined laterally one another laterally in a manner not unlike the interconnect system 135.

Figure 6:
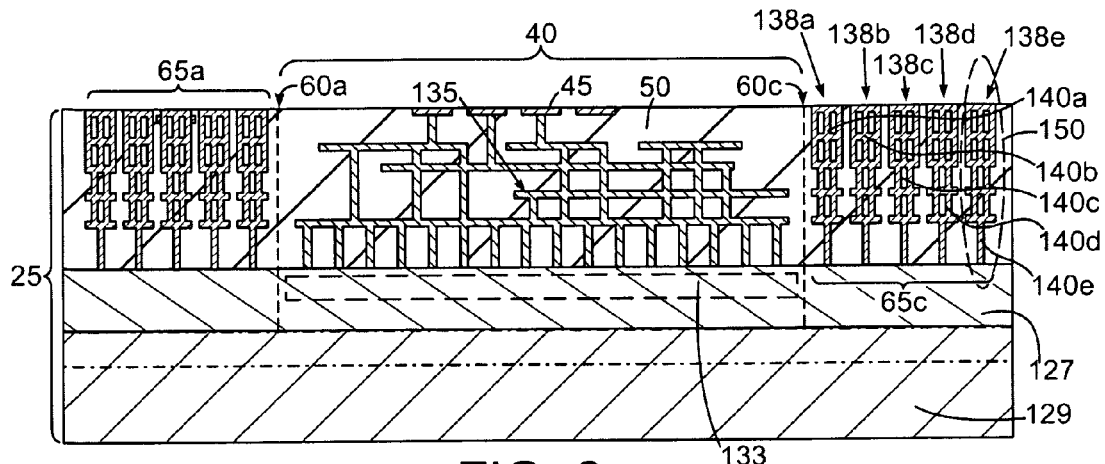
FIG. 6 is a sectional view of FIG. 3 taken at section 6-6.

Attention is now turned to FIG. 6, which is a sectional view of FIG. 3 taken at section 6-6. In this sectional view, the fillets 65a and 65c are visible on either side of the corners 60a and 60b of the active region 40. The interconnect system 135, interlevel dielectric 50 and pads 45 are also shown. The fillets 65a and 65c are positioned very close to the corners 60a and 60c of the active region 40. In this way, enhanced protection for the otherwise vulnerable corners 60a and 60c is provided for singulation related stresses and even post singulation stresses. Any cracks that might otherwise propagate into the corners 60a and 60c and thus the other corners 60b and 60d shown in FIG. 3 may be prevented from spreading into the interconnect system 135 and/or the active device structures 133 in the device layer 127 or even the base layer 129. All the fillets 65a, 65b, 65c and 65d may be substantially identical. Accordingly, the fillet 65c will be used to describe the others. Structurally speaking, the fillet 65c may be similar to the row 110c depicted in FIGS. 4 and 5. In this regard, the fillet 65c may consist of laterally spaced rows 138a, 138b, 138c, 138d and 138e. The rows 138a, 138b, 138c, 138d and 138e may consist of multiple segments extending into and out of the page. Five of those segments are visible and labeled 140a, 140b, 140c, 140d and 140e. The portion of FIG. 6 circumscribed by the dashed oval 150 will be shown at greater magnification in FIG. 7 to illustrate further details of the segment 140e and the interlevel dielectric 50.

Figure 7:
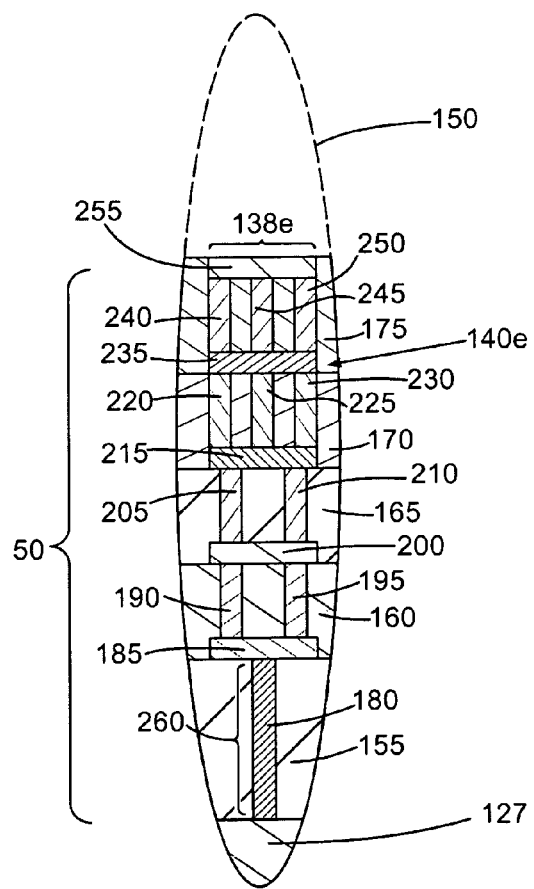
FIG. 7 is a portion of FIG. 6 shown at greater magnification.
Figure 8:
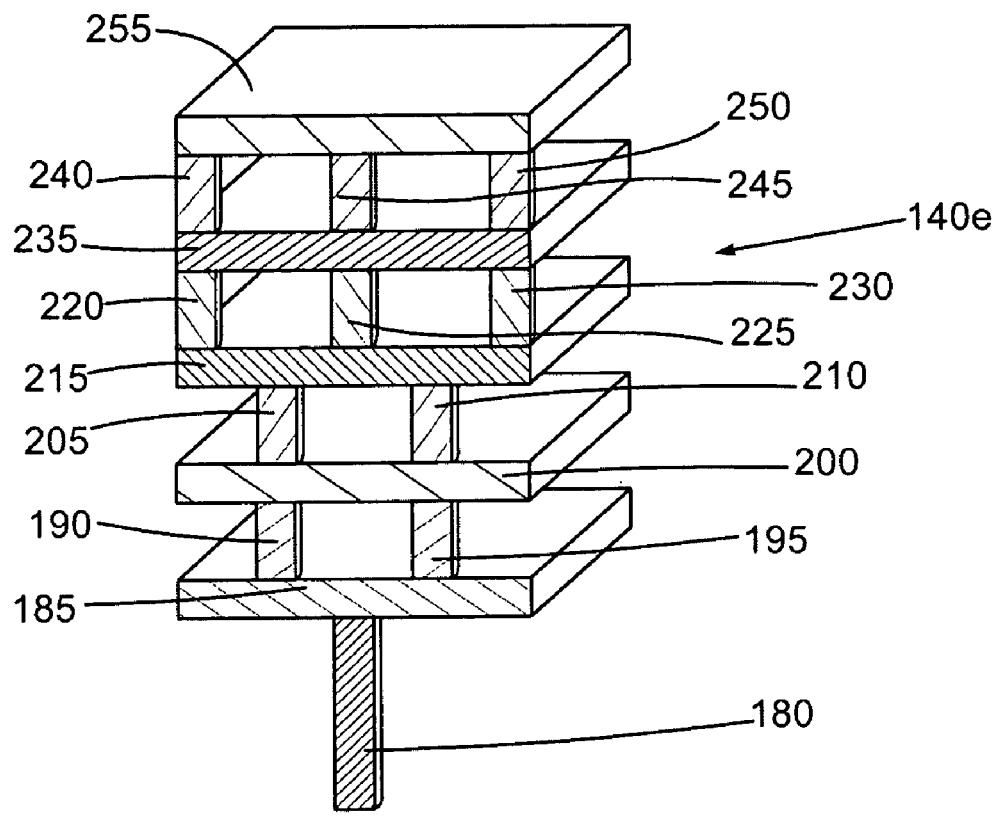
FIG. 8 is a pictorial view of one of the exemplary scribe structure segments of FIG. 6 shown pictorially and in section.

Attention is now turned to FIG. 7, which shows the segment 140e of the row 138e at greater magnification and to FIG. 8, which shows the segment 140e in 3D section and with the dielectric 50 visible in FIG. 7 removed. Note that because of the location of the dashed oval 150, a small portion of the active device layer 127 is visible in FIG. 7. As noted elsewhere herein, the interlevel dielectric layer 50 may be other than monolithic and thus consist of a series of build-up layers as shown. In this regard, the interlevel dielectric layer 50 may consist of separate interlevel dielectric layers 155, 160, 165, 170 and 175. The number of layers 155, 160, 165, 170 and 175 may be varied greatly depending upon the complexity of the interconnect structure 135 shown in FIGS. 3 and 5. Other insulating layers (not shown) may be applied to dielectric layer 175 if desired, such as passivation layer or stack of layers and a polymer layer, such as polyimide. The segment 140e may also consist of a stack of several elements. In this illustrative embodiment, the segment 140e includes a via 180 extending upward from the device layer 127, a conductor structure 185 formed on the via 180, two vias 190 and 195 formed on the conductor structure 185, a conductor structure 200 formed on the vias 190 and 195, two vias 205 and 210 formed on the conductor structure 200, a conductor structure 215 formed on the vias 205 and 210, three vias 220, 225 and 230 formed on the conductor structure 215, a conductor structure 235 formed on the vias 220, 225 and 230, three vias 240, 245 and 250 formed on the conductor structure 235 and a top conductor structure 255 formed on the vias 240, 245 and 250. All of the structures of the segment 140e and the dielectric layer 50 may be formed using well-known lithographic and material deposition techniques. For example, the interlevel dielectric layer 155 may be deposited as a dielectric film using chemical vapor deposition with or without plasma enhancement, spin-on or other techniques. A variety of materials may be used, such as silicon dioxide, tetra-ethyl-ortho-silicate, low-K materials such as organosilica glasses that incorporate terminal Si—H or Si—R (where R is an organic group) or polymers such as PTFE and aromatic polymers, such as SiLK™. A trench 260 may be formed in the layer 155 by etching or other techniques. The via 185 may then be formed in the trench 260 by well-known material deposition steps such as physical vapor deposition, chemical vapor deposition or electroplating as desired. In an exemplary embodiment, the via 180 may be composed of copper, aluminum, gold, platinum, palladium, silver, combinations of these or the like. If necessary or desired, various barrier layers such as tantalum and/or tantalum nitride may be deposited in the trench 260 prior to the deposition of the via 180. Subsequently, the conductor structure 185 may be formed on the interlevel dielectric layer 155 by well-known material deposition techniques, such as physical vapor deposition or plating, and patterned using well-known techniques, such as lithographic patterning and etching. The foregoing steps may be repeated to establish the remaining structures of the segment 140e.

The scribe structure 55 illustrated in FIGS. 2 and 3 described herein may be implemented in a variety of ways while still preserving the protective benefit of the fillets 65a, 65b, 65c and 65d. The number of row(s) may be varied. If segmented, the number and configuration of the segments may be varied as well. While a multi-level design has the benefit of dovetailing easily into existing interconnect fabrication processes, a more monolithic arrangement could be used if desired. Even dual-sided wafers could be fitted with the scribe structures described herein.

Figure 9:
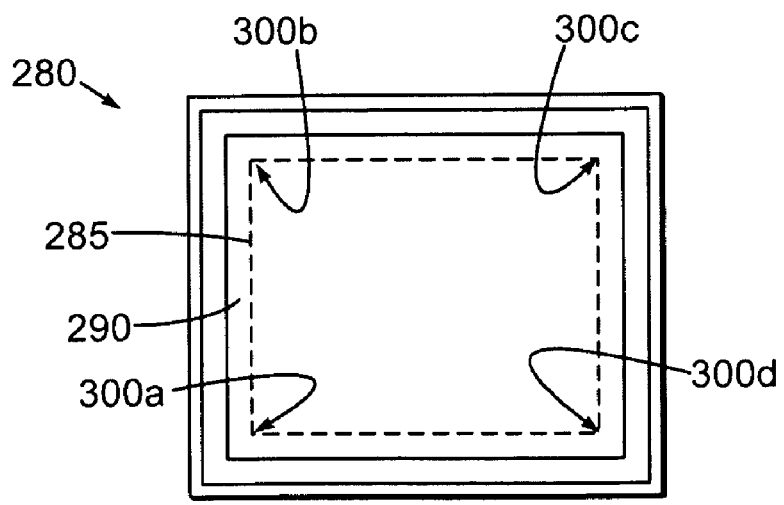
FIG. 9 is an overhead view like FIG. 3 but of a conventional die and scribe structure.

It may be useful at this point to contrast a conventional scribe line structure with the illustrative embodiments disclosed herein. In this regard, attention is now turned to FIG. 9, which is a overhead view of an exemplary conventional die 280 singulated from a conventional wafer (not shown). The active region 285 of the die 280 is circumscribed by a scribe structure 290 that is a conventional fully rectangular frame that does not include fillets proximate corners 300a, 300b, 300c and 300d of the active region 285.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
fabricating an active region of a semiconductor die so that the active region has at least one substantially right-angle corner;
fabricating a scribe structure around the active region so that the scribe structure includes at least one fillet, said fillet contacting the corner at the vertex of the right-angle, the scribe structure having a non-uniform cross-section; and
fabricating walls of the scribe structure with segments, such that the segments in the resulting wall comprise vias and conductor layers interspersed with interlevel dielectric material, comprising interlevel dielectric layers,
wherein the walls of the at least one fillet of the scribe structure are fabricated from a plurality of rows of separate segments and the plurality of rows of separate segments of the at least one fillet is greater than the plurality of rows of separate segments in the walls of the scribe structure not forming part of the at least one fillet.

2. The method of claim 1, comprising fabricating the scribe structure with plural rows of discrete supporting structures.

3. The method of claim 2, comprising fabricating each of the rows of discrete supporting structures from plural segments.

4. The method of claim 3, comprising fabricating each of the segments from plural stacked elements.

5. The method of claim 4, comprising fabricating each of the stacked elements from a conductor material.

6. The method of claim 1, comprising fabricating the scribe structure with four fillets.

7. The method of claim 1, comprising surrounding the scribe structure with a dielectric material layer.

8. The method of claim 7, wherein the dielectric material comprises plural stacked low-k dielectric layers.

9. A method of manufacturing, comprising:
in a semiconductor wafer including at least one die, fabricating an active region having at least one substantially right-angle corner;
fabricating a scribe structure around the active region so that the scribe structure includes at least one fillet, said fillet contacting the corner at the vertex of the right-angle, the scribe structure having a non-uniform cross-section; and
fabricating walls of the scribe structure with segments, such that the segments in the resulting wall comprise vias and conductor layers interspersed with interlevel dielectric layers,
wherein the walls of the at least one fillet of the scribe structure are fabricated from a plurality of rows of separate segments and the plurality of rows of separate segments of the at least one fillet is greater than the plurality of rows of separate segments in the walls of the scribe structure not forming part of the at least one fillet.

10. The method of claim 9, comprising fabricating the scribe structure with plural rows of discrete supporting structures.

11. The method of claim 10, comprising fabricating each of the rows of discrete supporting structures from plural segments.

12. The method of claim 11, comprising fabricating each of the segments from plural stacked elements.

13. The method of claim 12, comprising fabricating each of the stacked elements from a conductor material.

14. The method of claim 9, comprising fabricating the scribe structure with four fillets.

15. The method of claim 9, comprising surrounding the scribe structure with a dielectric material layer.

16. The method of claim of claim 15, wherein the dielectric material comprises plural stacked low-k dielectric layers.

17. The method of claim 9, comprising singulating the at least one die from the semiconductor wafer.

18. An apparatus, comprising:
a semiconductor die having an active region, the active region having at least one substantially right-angle corner;
a scribe structure bounding the active region, the scribe structure having at least one fillet positioned to contact the at least one substantially right-angle corner of the active region, the scribe structure having a non-uniform cross-section; and
the scribe structure having walls with segments having sequential vias and conductor layers interspersed with interlevel dielectric layers,
wherein the walls of the at least one fillet of the scribe structure comprise a plurality of rows of separate segments and the plurality of rows of separate segments of the at least one fillet is greater than the plurality of rows of separate segments in the walls of the scribe structure not forming part of the at least one fillet.

19. The apparatus of claim 18, wherein the scribe structure comprises plural rows of discrete supporting structures.

20. The apparatus of claim 19, wherein each of the rows of discrete supporting structures comprises plural segments.

21. The apparatus of claim 20, wherein each of the segments comprises plural stacked elements.

22. The apparatus of claim 21, wherein each of the stacked elements comprises a conductor material.

23. The apparatus of claim 18, comprising a dielectric material layer surrounding the scribe structure.

24. The apparatus of claim 23, wherein the dielectric material comprises plural stacked low-k dielectric layers.

25. The apparatus of claim 18, wherein the semiconductor die comprises part of a semiconductor wafer.

26. The method of claim 1, wherein
the scribe structure is fabricated as a frame having an outer edge and an inner edge, the inner edge being proximate to the active region, and including the at least one fillet,
wherein the scribe structure is further fabricated such that the distance from a corner of the scribe structure to the point of the fillet contacting the substantially right-angle corner is greater than the distance from the outer edge of the frame to the inside edge of the frame on the same side of the frame.

27. The method of claim 1, wherein the segments extend from a device layer up to the top interlevel dielectric layer of the interlevel dielectric material, the interlevel dielectric material supporting plural interconnect layers connecting circuitry in the active region to input/output pads at the top of the interlevel dielectric material.

* * * * *